United States Patent
Blanchard

(10) Patent No.: US 7,334,317 B2
(45) Date of Patent: Feb. 26, 2008

(54) METHOD OF FORMING MAGNETORESISTIVE JUNCTIONS IN MANUFACTURING MRAM CELLS

(75) Inventor: Philippe Blanchard, Moigny sur Ecole (FR)

(73) Assignees: Infineon Technologies AG, Neubiberg (DE); Altis Semiconductor, Corbeil Essonnes Cedex (FR)

( * ) Notice: Subject to any disclaimer, the term of this patent is extended or adjusted under 35 U.S.C. 154(b) by 177 days.

(21) Appl. No.: 11/145,183

(22) Filed: Jun. 6, 2005

(65) Prior Publication Data

US 2007/0000120 A1   Jan. 4, 2007

(51) Int. Cl.
*G11B 5/127* (2006.01)
*H04R 31/00* (2006.01)

(52) U.S. Cl. .............. 29/603.16; 29/603.13; 29/603.15; 29/603.18; 310/324.12; 310/324.2; 216/22; 216/39; 216/40; 427/127; 427/128; 451/5; 451/41

(58) Field of Classification Search .............. 29/603.13–603.16, 630.18; 360/126, 317, 360/324.2, 324.12; 216/22, 39, 40; 427/127, 427/128; 451/5, 41
See application file for complete search history.

(56) References Cited

U.S. PATENT DOCUMENTS

| | | | |
|---|---|---|---|
| 6,759,263 B2 * | 7/2004 | Ying et al. | 438/48 |
| 6,806,096 B1 | 10/2004 | Kim et al. | |
| 2003/0199104 A1 | 10/2003 | Leuschner et al. | |
| 2004/0084400 A1 | 5/2004 | Costrini et al. | |
| 2005/0051820 A1 | 3/2005 | Stojakovic et al. | |
| 2006/0245116 A1 * | 11/2006 | Klostermann et al. | 360/324.2 |

* cited by examiner

*Primary Examiner*—Paul D. Kim
(74) *Attorney, Agent, or Firm*—Edell, Shapiro & Finnan LLC

(57) ABSTRACT

A method of forming a magnetoresistive junction in a process of manufacturing a magnetoresistive memory cell includes providing a semiconductor substrate having at least one via contact layer on a main surface thereof, depositing a layered structure of magnetoresistive junction layers on the via contact layer, depositing an etch stop layer on the layered structure of magnetoresistive junction layers, depositing at least one hard mask layer on the etch stop layer, patterning and etching the hard mask layer to create a hard mask, removing of polymer residuals from the hard mask, etching of the etch stop layer, and etching the layered structure of magnetoresistive junction layers to create the magnetoresistive junction. The etching stops at the etch stop layer.

5 Claims, 2 Drawing Sheets

METHOD OF FORMING MAGNETORESISTIVE JUNCTIONS IN MANUFACTURING MRAM CELLS

FIELD OF THE INVENTION

The present invention relates to non-volatile semiconductor memory chips and, more particularly, to a method of forming a magnetoresistive junction in a process of manufacturing magnetoresistive random access memory cells (MRAM cells) for use in a semiconductor integrated circuit.

BACKGROUND

In the semiconductor industries, strong efforts are made to bring a new promising memory technology based on non-volatile MRAM cells into practical use. An MRAM cell includes a stacked structure of magnetic layers separated by a non-magnetic tunneling barrier layer or conductive barrier. With a non-magnetic tunneling barrier layer, a magnetoresistive tunnel junction (MTJ) memory cell is formed. With a conductive barrier, a giant magnetoresistive memory cell is formed. Here, and in agreement with conventional reading in the art, both alternatives are referred to as "a magnetoresistive junction."

In MRAM cells, digital information is not maintained by power as in conventional DRAMs, but rather by directions of magnetization in the ferromagnetic layers. More specifically, in an MRAM cell, magnetization of one ferromagnetic layer ("reference layer" or "pinned layer") is magnetically fixed or pinned, while magnetization of the other ferromagnetic layer ("free layer") is free to switch between two preferred directions along an axis of magnetization thereof. The axis of magnetization is typically parallel to the reference layer fixed magnetization.

Depending upon the magnetic orientation of the free layer, an MRAM cell exhibits two different resistance values in response to a voltage applied across the MRAM cell, wherein the resistance thereof is "low" when magnetizations are in parallel alignment and "high" when magnetizations are in anti-parallel alignment. Accordingly, logic values ("0" and "1") may be assigned to different magnetizations of the free layer and detection of electric resistance provides the logic information stored in the magnetic memory element. An MRAM cell is typically written to by applying magnetic fields created by bi- or uni-directional currents that run through conductive lines operatively located adjacent the MRAM cell so that magnetic fields thereof can be coupled to the free layer magnetization.

In accordance with the well-known standard CMOS process for manufacturing MRAMs, upon a silicon or other suitable substrate provided with active substrate devices, such as transistors, typically, a tri-layered structure including a ferromagnetic bottom layer, a conductive or non-conductive intermediate layer, and ferromagnetic bottom layer, is deposited on dielectric material, followed by depositing a hard mask, patterning thereof, and etching of the tri-layered structure to produce magnetoresistive junctions, such as magnetoresistive tunnel junctions (MTJs).

However, in such conventional manufacturing of magnetoresistive memory elemens, etching of the tri-layered structure may be accompanied by deposition of polymer residuals on the side walls of the future magnetoresistive junctions. Such polymer residuals may cause severe problems, such as a hard fail (short) or interlevel short (MT to MA). Hence, removal of the polymer residuals is desirable, but likely to destroy the magnetoresistive junction. Therefore, at present, removal of polymer residuals is avoided.

An improved method of manufacturing MRAM cells where magnetoresistive junction can be formed without having problem as to polymer residuals is desirable.

SUMMARY

A method of forming magnetoresistive junctions in a process of manufacturing magnetoresistive memory cells includes providing a semiconductor substrate with active structure devices, such as transistors, and at least one via contact layer, i.e., a dielectric layer having at least one via contact formed therein, depositing a layered structure of magnetoresistive junction layers on said via contact layer, depositing an etch stop layer on the layered structure of magnetoresistive junction layers, depositing a layered structure of at least one hard mask layer on the etch stop layer; patterning and etching the hard mask layers, removing of polymer residuals from the hard mask, etching of the etch stop layer, and etching of the layered structure of magnetoresistive junction layers to create a magnetoresistive junction. The via contact layer is deposited on a metallization layer, i.e., a dielectric layer having at least one conductive (metallic) line formed therein. The layered structure is a tri-layered structure including a ferromagnetic bottom layer, a conductive or non-conductive intermediate layer, and a ferromagnetic top layer. Alternatively, instead of the ferromagnetic top and bottom layers, the layered structure includes ferromagnetic top and bottom regions, respectively, with at least one ferromagnetic layer. The etching stops on the etch stop layer to create a hard mask.

While the above description refers to a method of forming a single magnetoresistive junction, it is to be understood that such description also refers to a plurality of magnetoresistive junctions.

As the polymer residuals are removed before etching of the layered structure of magnetoresistive junction layers, removal of polymer residuals occurs without risking degradation of magnetoresistive junctions. Further, later encapsulation of magnetoresistive junctions within dielectric material is improved.

The etch stop layer is, for example, a thin conductive layer of ruthenium (Ru), tantalum nitride (TaN), or tungsten nitride (WN). However, any other material can be used as etch stop layer material as long as the material has sufficient etch selectivity with respect to the overlying hard mask layer(s). A thickness of the etch stop layer is in a range of approximately 5 nm to 10 nm.

Other and further objects, features and advantages of the invention will appear more fully from the following description.

BRIEF DESCRIPTION OF THE DRAWINGS

The accompanying drawings, which are incorporated in and constitute a part of the specification, illustrate an embodiment of the invention, and together with the general description given above and the detained description given below, serve to explain the principles of the invention.

DETAILED DESCRIPTION

An embodiment of the present invention will be described in detail below with reference to the accompanying drawings, where like designations denote like or similar elements.

FIGS. 1 to 5 depict schematically vertical sectional (partial) views of consecutive intermediate products in forming a magnetoresistive junction in manufacturing MRAM cells.

Figure 1:
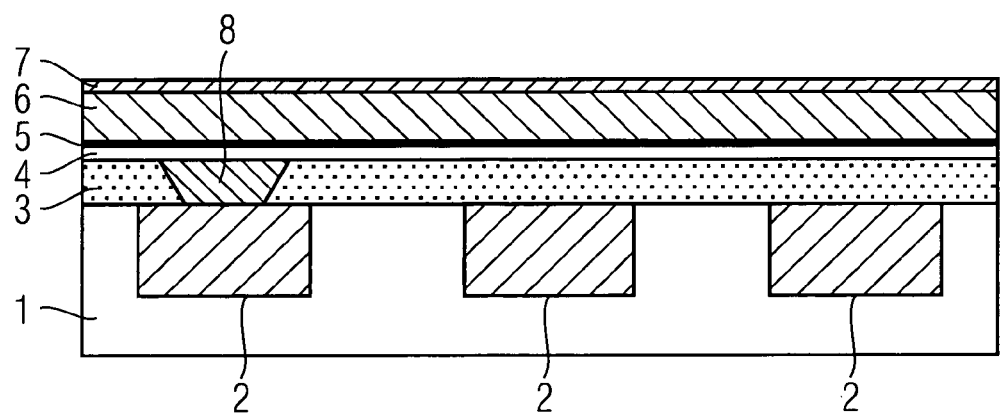
FIG. 1 depicts schematically a vertical sectional view of an intermediate product in forming a magnetoresistive junction in manufacturing MRAM cells.

Referring to FIG. 1, a layer of dielectric material, such as silicon oxide, and metallic lines 2 of conductive material, such as copper (Cu), are formed to create metallization layer 1. On the metallization layer 1, a SiN-layer 3 is deposited and a via contact 8 of the conductive material is formed within SiN-layer 3. Then, a layered structure 4 of magnetoresistive junction layers, which are, for example, a tri-layered structure including a ferromagnetic bottom layer, a conductive or non-conductive intermediate layer, and a ferromagnetic top layer is deposited on the silicon nitride (SiN)-layer 3. Alternatively, the layered structure 4 has ferromagnetic top and bottom regions, respectively, including at least one ferromagnetic layer, instead of the ferromagnetic top and bottom layers. A thin etch stop layer 5 made of Ru with a thickness of approximately 10 nm is deposited on the layered structure 4. Then, a layered structure of hard mask layers including a TiN-layer 6 and silane oxide layer 7 is deposited on the etch stop layer 5.

Figure 2:
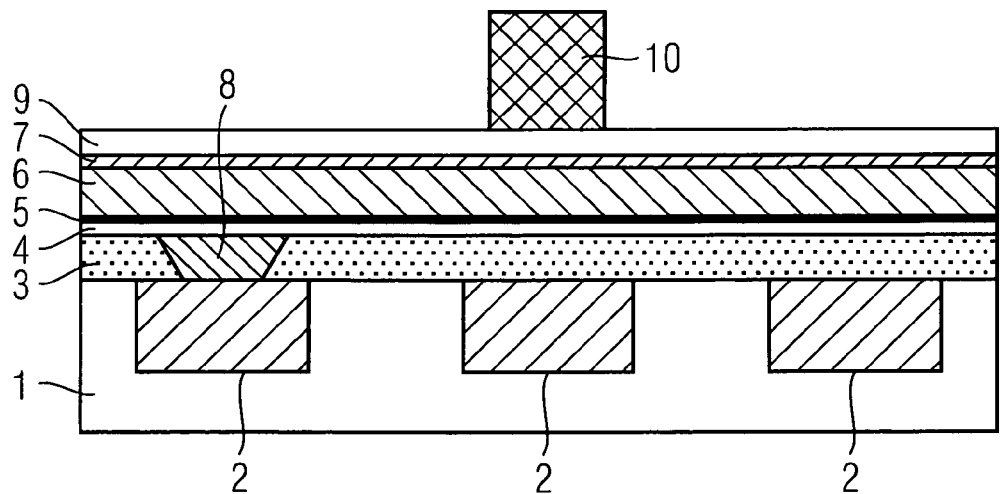
FIG. 2 depicts schematically a vertical sectional view of an intermediate product subsequent to the intermediate product of FIG. 1.

An anti-reflective layer 9 and a photo resist layer are deposited on the silane oxide layer 7. The photo resist layer is then patterned to form resist mask 10 (FIG. 2).

Figure 3:
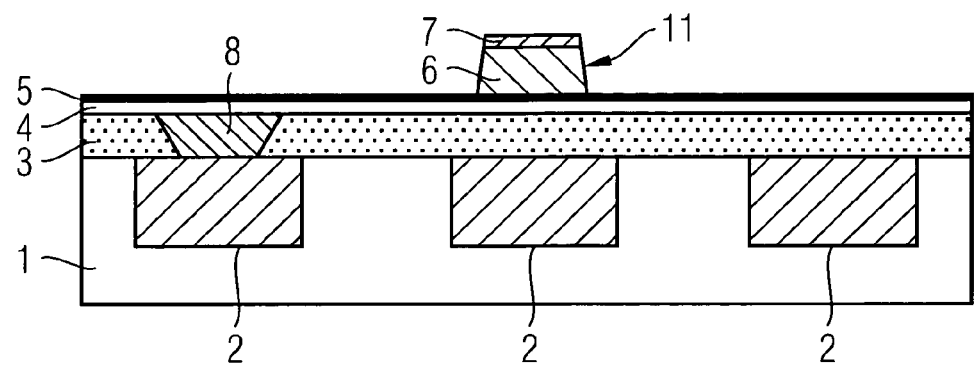
FIG. 3 depicts schematically a vertical sectional view of an intermediate product subsequent to the intermediate product of FIG. 2.

Then, hard mask layers 6, 7 are etched using resist mask 10 to create hard mask 11 (FIG. 3). Etching creates polymer residuals applied on the walls of hard mask 11.

Figure 4:
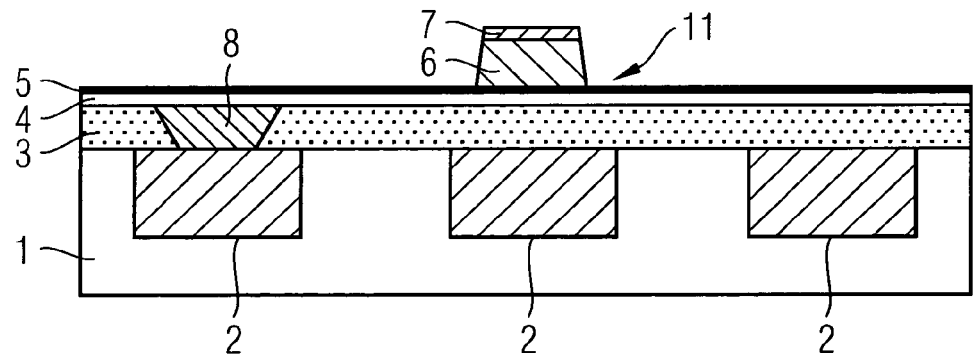
FIG. 4 depicts schematically a vertical sectional view of an intermediate product subsequent to the intermediate product of FIG. 3.
Figure 5:
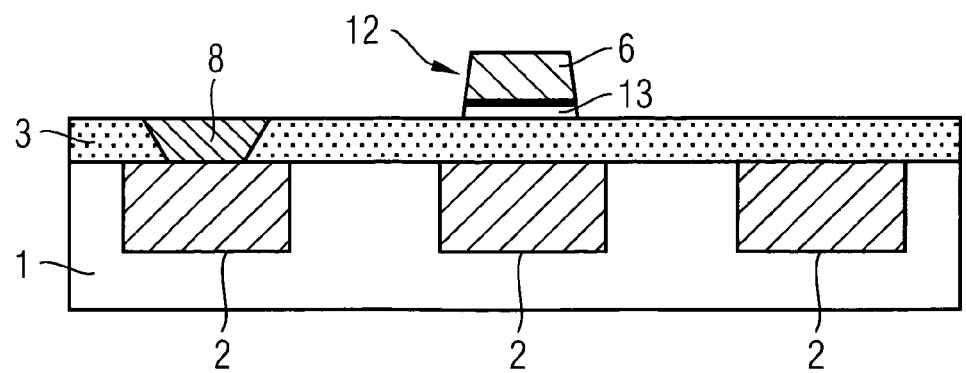
FIG. 5 depicts schematically a vertical sectional view of an intermediate product subsequent to the intermediate product of FIG. 4.

After etching hard mask layers 6, 7, ex situ cleaning is performed, for instance, using chromic phoshoric to remove polymer residuals applied on the walls of hard mask 11 (FIG. 4).

Then, etch stop layer 5 and layered structure 4 of magnetoresistive junction layers are etched to create magnetoresistive junction stack 12 including magnetoresistive junction 13. Also, silane oxide layer 7 is removed during etching.

Obviously many modifications and variations of the present invention are possible in light of the above description. It is therefore to be understood, that within the scope of appended claims, the invention may be practiced otherwise than as specifically devised.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

REFERENCE LIST

1 Metallization layer
2 Metallic line
3 SiN-layer
4 Magnetoresistive junction layered structure
5 Etch stop layer
6 Titanium nitride layer
7 Silane oxide layer
8 Via contact
9 Anti-reflective layer
10 Resist mask
11 Hard mask
12 Magnetoresistive junction stack
13 Magnetoresistive junction

What is claimed is:

1. A method of manufacturing a magnetoresistive memory cell comprising a process of forming a magnetoresistive junction the process comprising:

providing a semiconductor substrate comprising at least one via contact layer on a main surface of the semiconductor substrate;

depositing a layered structure of magnetoresistive junction layers on the via contact layer;

depositing an etch stop layer on the layered structure of magnetoresistive junction layers;

depositing at least one hard mask layer on the etch stop layer;

patterning and etching the hard mask layer to create a hard mask, where etching stops at the etch stop layer;

removing of polymer residuals from side surfaces of the hard mask; and selectively etching, via the hard mask, the etch stop layer and the layered structure of magnetoresistive junction layers to create the magnetoresistive junction.

2. The method of claim 1, wherein the etch stop layer is a conductive layer.

3. The method of claim 1, wherein a thickness of the etch stop layer is in a range between approximately 5 nm to 10 nm.

4. The method of claim 1, wherein the etch stop layer comprises Ru, TaN or WN.

5. The method of claim 1, wherein the at least one via contact layer includes a dielectric material with at least one contact via extending through the dielectric material.

* * * * *